United States Patent
Westmoreland et al.

(12) 
(10) Patent No.: US 7,182,979 B2
(45) Date of Patent: *Feb. 27, 2007

(54) HIGH EFFICIENCY METHOD FOR PERFORMING A CHEMICAL VAPORDEPOSITION UTILIZING A NONVOLATILE PRECURSOR

(75) Inventors: Donald L. Westmoreland, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/213,030

(22) Filed: Aug. 5, 2002

(65) Prior Publication Data

US 2002/0192376 A1 Dec. 19, 2002

Related U.S. Application Data

(60) Division of application No. 09/097,489, filed on Jun. 15, 1998, now Pat. No. 6,428,623, which is a continuation of application No. 08/909,695, filed on Aug. 12, 1997, now abandoned, which is a continuation of application No. 08/395,942, filed on Feb. 28, 1995, now abandoned, which is a continuation-in-part of application No. 08/236,946, filed on May 2, 1994, now Pat. No. 5,393,564, which is a continuation-in-part of application No. 08/062,203, filed on May 14, 1993, now abandoned.

(51) Int. Cl.
*C23C 16/00* (2006.01)
*C23C 16/06* (2006.01)
*C23C 16/22* (2006.01)

(52) U.S. Cl. .................. 427/248.1; 427/250; 427/252; 427/255.28; 427/255.31; 427/421.1

(58) Field of Classification Search ............. 427/248.1, 427/250, 252, 255.28, 255.31, 421
See application file for complete search history.

(56) References Cited

U.S. PATENT DOCUMENTS 3,008,447 A 11/1961 Lacroix ........................ 118/58

(Continued)

FOREIGN PATENT DOCUMENTS

FR 2707671 1/1995

(Continued)

OTHER PUBLICATIONS

Albin, David.S. ,et al. ,"Spray Pyrolysis Processing of Optoelectronic Materials", *Advanced Ceramic Materials*, vol. 2, No. 3A,(1987),pp. 243-252.

(Continued)

*Primary Examiner*—Bret Chen
(74) *Attorney, Agent, or Firm*—Schwegman, Lundberg, Woessner & Kluth, P.A.

(57) ABSTRACT

A method directed to the use of a nonvolatile precursor, either a solid or liquid precursor, suitable for CVD, including liquid source CVD (LSCVD). Using the method of the invention the nonvolatile precursor is dissolved in a solvent. Choice of solvent is typically an inorganic compound that has a moderate to high vapor pressure at room temperature, which can be liquified by combination of pressure and cooling. The solution is then transported at an elevated pressure and/or a reduced temperature to the CVD chamber. The solution evaporates at a higher temperature and a lower pressure upon entry to the CVD chamber, and the nonvolatile precursor, in its gaseous state, along with a gas reactant, produces a product which is deposited on a semiconductor wafer. In LSCVD the liquid enters the chamber, contacts the wafer, evaporates, produces a product which is deposited as a thin film.

35 Claims, 1 Drawing Sheet

U.S. PATENT DOCUMENTS

| | | | |
|---|---|---|---|
| 4,176,209 A | 11/1979 | Baker et al. | 427/248 B |
| 4,349,498 A * | 9/1982 | Ellis et al. | 264/81 |
| 4,571,350 A | 2/1986 | Parker et al. | 427/109 |
| 4,649,857 A | 3/1987 | Hayashi et al. | 118/326 |
| 4,670,350 A * | 6/1987 | Rukavina | 428/520 |
| 4,689,247 A | 8/1987 | Doty et al. | 427/126.1 |
| 4,746,501 A * | 5/1988 | Maya | 423/413 |
| 4,906,493 A | 3/1990 | Laine | 427/226 |
| 4,970,093 A * | 11/1990 | Sievers et al. | 427/575 |
| 4,993,361 A | 2/1991 | Unvala | 118/723 |
| 5,002,928 A * | 3/1991 | Fukui et al. | 505/401 |
| 5,090,985 A | 2/1992 | Soubeyrand et al. | 65/60.52 |
| 5,120,703 A | 6/1992 | Snyder et al. | 505/1 |
| 5,171,734 A * | 12/1992 | Sanjurjo et al. | 505/447 |
| 5,258,204 A | 11/1993 | Wernberg et al. | 427/255 |
| 5,270,248 A * | 12/1993 | Rosenblum et al. | 438/61 |
| 5,271,957 A * | 12/1993 | Wernberg et al. | 427/109 |
| 5,278,138 A | 1/1994 | Ott et al. | 505/1 |
| 5,300,321 A | 4/1994 | Nakano et al. | 427/248.1 |
| 5,344,792 A | 9/1994 | Sandhu et al. | 437/200 |
| 5,381,755 A | 1/1995 | Glesener et al. | 117/88 |
| 5,393,564 A * | 2/1995 | Westmoreland et al. | 427/248.1 |
| 5,421,895 A | 6/1995 | Tsubouchi et al. | 118/726 |
| 5,451,260 A * | 9/1995 | Versteeg et al. | 118/725 |
| 5,478,610 A | 12/1995 | Desu et al. | 427/573 |
| 5,505,781 A | 4/1996 | Omori et al. | 118/726 |
| 5,536,323 A | 7/1996 | Kirlin et al. | 118/726 |
| 5,688,565 A | 11/1997 | McMillan et al. | 427/565 |
| 5,916,640 A | 6/1999 | Liu et al. | 427/475 |
| 5,924,012 A | 7/1999 | Vaarstra | 438/681 |
| 5,968,594 A * | 10/1999 | Hu et al. | 427/248.1 |
| 6,010,969 A | 1/2000 | Vaarstra | 438/758 |

FOREIGN PATENT DOCUMENTS

WO     WO-86/00058     11/1986

OTHER PUBLICATIONS

Versteeg, Vera.A. ,et al. ,"Metalorganic Chemical Vapor Deposition by Pulsed Liquid Injection Using an Ultrasonic Nozzle: Titanium Dioxide on Sapphire from Titanium (IV) Isopropoxide", *J. of the American Ceramic Society*, vol. 78, No. 10,(Oct. 1995),2763-2767.

\* cited by examiner

HIGH EFFICIENCY METHOD FOR PERFORMING A CHEMICAL VAPORDEPOSITION UTILIZING A NONVOLATILE PRECURSOR

This application is a Divisional of U.S. application Ser. No. 09/097,489, filed Jun. 15, 1998, now U.S. Pat. No. 6,428,623, which is a Continuation of U.S. application Ser. No. 08/909,695, filed Aug. 12, 1997, now abandoned, which is a File Wrapper Continuation of U.S. application Ser. No. 08/395,942, filed Feb. 28, 1995, now abandoned, which is a Continuation-In-Part of U.S. application Ser. No. 08/236,946, filed May 2, 1994, now U.S. Pat. No. 5,393,564, which is a Continuation-In-Part of U.S. application Ser. No. 08/062,203, filed May 14, 1993, now abandoned, all of which are incorporated herein by reference.

FIELD OF THE INVENTION

The invention relates to the manufacture of semiconductor circuits on semiconductor wafers, and more particularly to chemical vapor depositions of materials on the wafer.

BACKGROUND OF THE INVENTION

A large number of nonvolatile metal organic precursors which are suitable in microelectronics applications for chemical vapor deposition (CVD) of thin films are solids at temperatures at or below 1500 Kelvin and at pressures at or above $10^{-10}$ Torr. In fact, a majority of metal-organic compounds with attributes desirable for CVD are solids. These compounds have chemical stability, molecular structures, and reactivity which make them ideally suited for CVD application. However, vapor transport is difficult to perform under temperatures and pressures typically utilized in semiconductor manufacture. Thus, vapor transport of these precursors is a major hinderance to the implementation of the precursors in a production environment. If the precursor has a sufficient vapor pressure, then sublimation of the precursor for transportation of its vapor is the only option available, however this is difficult to control in a manufacturing environment. Solid precursors have been dissolved, transported, and delivered in organic solution, but these solutions usually leave a large carbon residue.

OBJECTS OF THE INVENTION

It is an object of the invention to provide reliable production worthy methods for fast delivery of nonvolatile precursors to the chemical vapor deposition (CVD) chamber.

The invention features dissolving a nonvolatile precursor, either solid or liquid, in a solution and delivering the precursor in the solution to a CVD chamber.

The invention is a very efficient method for transporting a nonvolatile precursor for CVD in the manufacturing environment and incorporates a minimum amount of unwanted by-product in the desired film. The method entails a process which is easily controlled and therefore predictable with repeatable results.

SUMMARY OF THE INVENTION

The invention is a method directed to the use of a nonvolatile precursor, either solid or liquid, in a chemical vapor deposition (CVD) process. A solid precursor, as referenced herein, is a precursor which is in a solid state at a temperature at or below 1500 Kelvin and at a pressure at or above $10^{-10}$ Torr, and a liquid precursor, as referenced herein, is a precursor which is in a liquid state at a temperature at or below 1500 Kelvin and at a pressure at or below $10^{-10}$ Torr. Using the method of the invention the nonvolatile precursor is dissolved in a solvent to form a solution. The nonvolatile precursor is then transported in the solution at a pressure and a temperature necessary to maintain it as a liquid to the CVD chamber. The solution is transported in a continuous liquid stream to the CVD chamber. A continuous liquid stream is an unbroken non-nebulized stream of liquid which may be passed to the chamber without interruption or may be passed to the chamber in a pulse or batch. The pulse or batch can be thought of as a portion of the solution.

In a first embodiment the solution becomes a gas during rapid evaporation of the solution at a high temperature and at a low pressure. The gaseous form of the precursor reacts with a reactant at the heated surface of the wafer.

In a second embodiment the method of the invention can be used in liquid source chemical vapor deposition where the solution is applied to the wafer before being evaporated.

DETAILED DESCRIPTION OF THE INVENTION

Figure 1:
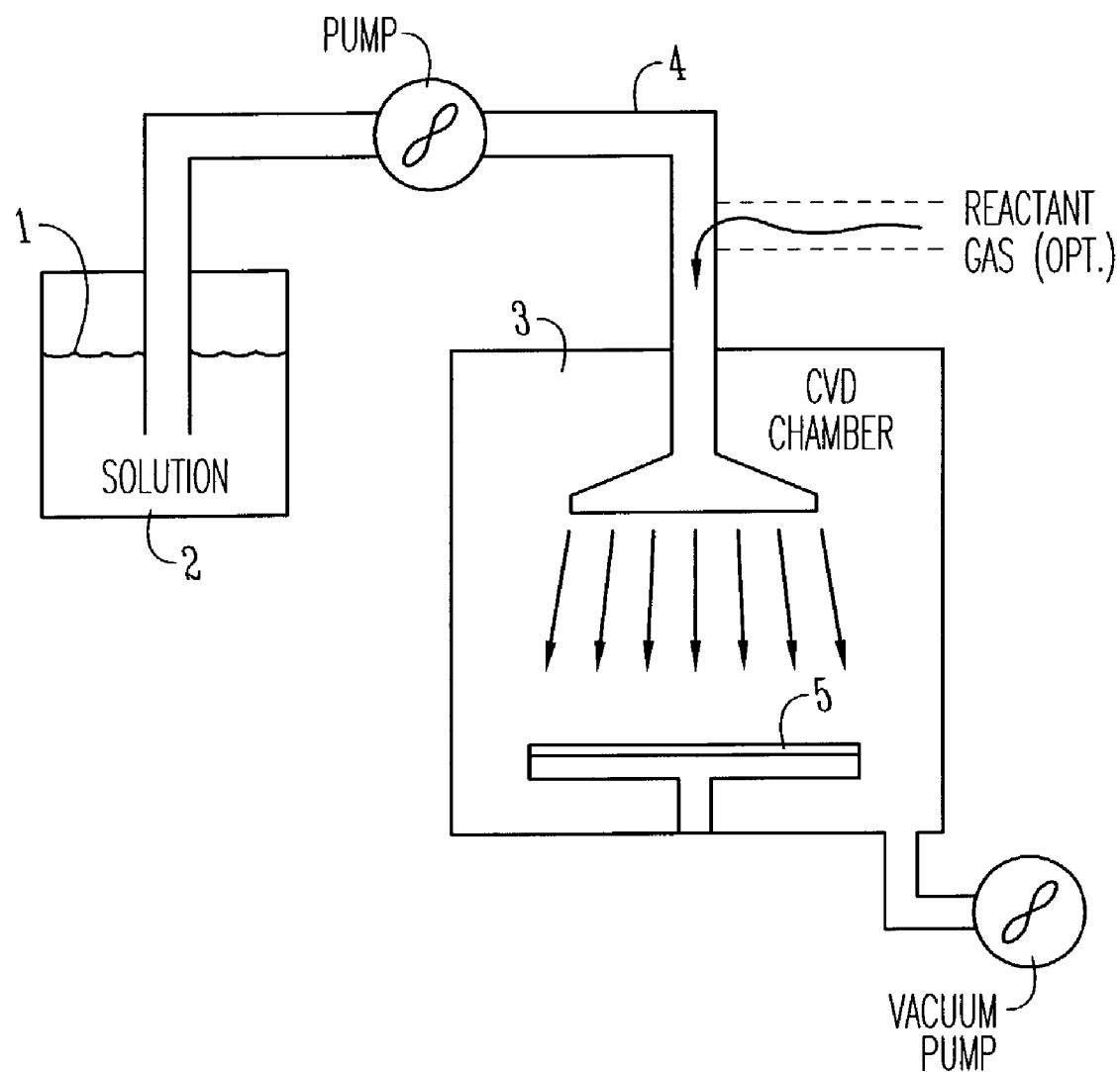
FIG. 1 is a cross section of a simplified representation of the equipment used to perform a chemical vapor deposition on a semiconductor wafer.

The invention is a method directed to the use of a nonvolatile precursor suitable for chemical vapor deposition (CVD). The nonvolatile precursor may be a solid or a liquid. The solid precursor, as referenced herein, is a precursor which is in a solid state at a temperature at or below 1500 Kelvin and at a pressure at or above $10^{-10}$ Torr, and the liquid precursor, as referenced herein, is in a liquid state at a temperature at or below 1500 degrees Kelvin and at a pressure at or above $10^{-10}$ Torr. The method can be understood by studying FIG. 1 in conjunction with the following description. Using the method of the invention, the nonvolatile precursor is dissolved in a solvent to form a solution 1 of the precursor and the solvent. It is important that the precursor and the solvent do not react with each other in liquid form. The solvent can be either a reactive component which makes up a part of the film or it can be simply a nonreactive inert carrier.

The solution 1 is formed in a chamber 2. The solution 1 is then transported in liquid form at elevated pressures and/or reduced temperatures to a chamber 3 through a transport device 4. The liquid is transported as a continuous liquid stream to the chamber 3. A continuous liquid stream is an unbroken non-nebulized stream of liquid which may be passed to the chamber without interruption or may be passed to the chamber in a pulse or batch. The pulse or batch can be thought of as a portion of the solution. When the solution 1 reaches the chamber 3, at least two options are available.

In a first embodiment the solution 1 becomes a gas upon entry to the chamber 3. The chamber 3 is held at a high enough temperature and a low enough pressure to effect rapid evaporation of the solution 1. The precursor remains in the gas phase until it reacts with a reactant at a heated surface of the wafer 5. The reactant may be either the solvent in its gaseous state or may be another gas injected into the chamber 3. In either case a material is produced during the reaction and deposited as a film on the wafer 5. Typically, a gaseous by-product is also produced in the reaction.

One example of the first embodiment comprises a solid precursor of bis(cyclopentadienly)titanium diazide (Tiaz) dissolved in liquid ammonia (LNH$_3$) to form a solution 1 of Tiaz in LNH$_3$ in chamber 2 when the temperature of chamber 2 is 20° C. or less and the pressure is 120 psi or greater. The Tiaz in LNH$_3$ is then transported to the chamber 3 through the transport device 4. The temperature and pressure of the transport device 4 are regulated in order to keep the solution in it liquid form. In this example the temperature is 20° or less and the pressure is 120 psi or greater. The solution 1 immediately vaporizes upon entry into chamber 3. The rapid evaporation occurs because the chamber 3 is held at a temperature of 100° C. and a pressure of 500 millitorr and the water surface is held at 550° C. Hydrogen is injected into the chamber and combines with the vaporized Tiaz to form titanium nitride which is deposited on the wafer as a thin film. A by-product cyclopentadiene remains and is pumped from the chamber with the ammonia vapor.

The temperatures and pressures may be varied as long as the temperature and pressure of the chamber and transport device allow the precursor to remain dissolved in the solution. In addition the temperature and pressure of the chamber may vary as long as the solution is vaporized.

In a second embodiment, the solution 1 is applied to the wafer 5 before being evaporated. This is typically referred to as liquid source chemical vapor deposition. The solution is delivered through a nebulizer which delivers a very fine mist that settles evenly over the entire wafer. When the solution first contacts the wafer the temperature of the wafer 5 may be either higher, or lower, or the same as the temperature of the solution 1. In the first case the wafer temperature and chamber 3 pressure must be maintained so that the solvent evaporates upon contact with the wafer surface and so that the precursor reacts immediately with the reactant gas, which is either injected into the chamber or formed during evaporation of the solution, to deposit a film. In the latter two cases, the solution remains on the wafer until the wafer temperature is increased to evaporate the solvent. As in the case of the first embodiment the gaseous state of the precursor reacts with a gas reactant thereby producing a material deposited as a film on the wafer surface. The reaction typically produces a gaseous by-product in addition to the deposited film. The by-product and the solvent vapor, in the case where the vapor doesn't react with the precursor to form the film, are then removed from the chamber 3.

An example of the process of the second embodiment comprises a precursor, zirconium tetrachloride, dissolved in a solvent, silicon tetrachloride, to form a solution in chamber 2 when the temperature of the chamber 2 is between 60° and 10° C. and the pressure is 60 psi or greater. The solution is then transported to the chamber 3 through the transport device 4. The temperature and pressure of the transport device 4 are regulated in order to maintain the solution in its liquid form. In this example the temperature and pressure of the transport device 4 are the same as the temperature and pressure of chamber 2. Chamber 3 is held at a pressure of 10 torr in order to help facilitate the vaporization of the solution on the wafer. The wafer temperature is 600° C. The zirconium tetrachloride in silicon tetrachloride solution is injected into the chamber 3 and reacts at the wafer surface to form a vapor and combines with hydrogen to form zirconium silicide which is deposited on the wafer to form a thin film. A by-product, hydrogen chloride, is formed and is pumped from the chamber with the excess silicon tetrachloride.

It is important to use the correct solvent when performing the method of the invention. The solvent must be able to evaporate quickly and leave no contaminates in the product film. Therefore common hydrocarbon solvents are unacceptable because they leave carbon residue incorporated in the wafer film, dependent on the wafer. Ideal solvents for this application are inorganic liquids such as: liquid ammonia (NH$_3$), liquid NO$_2$, liquid SO$_2$, liquid TiCl$_4$, liquid TaCl$_5$, liquid WF$_6$, liquid SiCl$_4$, borazine, dimethyl hydrazine, liquid xenonflourides, liquid phosphine, liquid arsine, diethylzinc, BCl$_3$, BF$_3$, SF$_6$, H$_2$S, SiF$_4$, CBrF$_3$, CCl$_2$F$_2$, CCl$_3$F, CClF$_3$, CCl$_4$, SiH$_2$Cl$_2$. Many of these solvents are gases at room temperature but are easily maintained as liquids with elevated pressure and reduced temperature. For example, ammonia boils at −33° C. and is an excellent solvent. It is a further advantage that these gases are easily available at a low cost at the present time.

The following gases may be selected as reactant gases for forming the deposited film: hydrogen, ammonia, or silane.

The following are some of the solid precursors suitable for forming films on semiconductor wafers by the method of the invention: bis(cyclopentadienyl) titanium dichloride, ZrCl4, and tungsten carbonyl.

The following are some of the nonvolatile liquid precursors suitable for forming films on semiconductor wafers by the method of the invention: indenyltris(dimethylamido) zirconium, cyclopentadienyltris(diethylamido)titanium, and bis(cyclopentadienyl)bis(dimethylamido)titanium.

There are various combinations of nonvolatile precursors, solvents and reactants that may be used in the process of the invention.

It has been shown that the invention provides an efficient method for transporting nonvolatile precursors for CVD in the manufacturing environment.

Although the invention has been described in terms of a depositing materials on semiconductor wafers during chemical vapor depositions, the circuit and method have utility in other processes where a chemical vapor deposition is desired. Accordingly the invention should be read as limited only by the claims.

What is claimed is:

1. A method for performing a chemical vapor deposition, comprising:
    providing a solution comprising a nonvolatile precursor suitable for chemical vapor deposition dissolved in a solvent, wherein the solvent is an inorganic liquid;
    transporting the solution as a liquid stream to a chemical vapor deposition chamber;
    subjecting the solution to a temperature and pressure higher than atmospheric pressure sufficient to maintain the solution in a liquid state during transporting;
    nebulizing the liquid stream in the chemical vapor deposition chamber;
    applying the nebulized liquid stream to a semiconductor wafer surface, wherein the wafer surface is at a temperature less than that of the solution during transporting; and
    subjecting the nebulized liquid stream to a temperature and a vacuum pressure in the chemical vapor deposition chamber by raising the wafer to a temperature sufficient to rapidly evaporate the solvent after the solution contacts the semiconductor wafer.

2. The method according to claim 1, wherein the nonvolatile precursor and the solvent do not react with each other in liquid form.

3. The method according to claim 1, wherein the solvent is liquid ammonia, liquid NO$_2$, liquid SO$_2$, liquid TiCl$_4$, liquid xenonfourides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, or $SiH_2Cl_2$.

4. The method according to claim 1, wherein the precursor is a solid.

5. The method of claim 1, wherein the precursor is bis(cyclopentadienyl) titanium dichloride, $ZrCl_4$, or tungsten carbonyl.

6. The method of claim 1, wherein the precursor is a nonvolatile liquid.

7. The method of claim 1, wherein the precursor is indenyltris(dimethylamido)zirconium, cyclopentadienyltris(diethylamido)titanium, or bis(cyclopentadienyl)bis(dimethylamido)titanium.

8. The method of claim 1, wherein subjecting the solution to a temperature and a pressure in the chemical vapor deposition chamber sufficient to evaporate the solution includes reacting the precursor with a reactant to form a film on the surface of the wafer.

9. A method for performing a chemical vapor deposition, comprising:
dissolving a precursor suitable for chemical vapor deposition in a volatile inorganic solvent to form a solution;
transporting the solution as a continuous liquid stream to a chemical vapor deposition chamber;
subjecting the solution to a temperature and pressure higher than about twice atmospheric pressure sufficient to maintain the solution in a liquid state during transporting;
nebulizing the liquid stream as it enters the chemical vapor deposition chamber;
applying the solution to a semiconductor wafer, wherein the semiconductor wafer is at a temperature less than that of the solution; and
subjecting the solution to a high enough temperature and a low enough vacuum pressure in the chemical vapor deposition chamber by raising the semiconductor wafer to a high enough temperature to evaporate the solvent after the solution contacts the semiconductor wafer.

10. The method according to claim 9, wherein dissolving a precursor includes selecting a precursor and a solvent that do not react with each other in liquid form.

11. The method according to claim 9, wherein the volatile inorganic solvent is liquid ammonia.

12. The method according to claim 9, wherein the precursor is selected from the group consisting of bis(cyclopentadienyl) titanium dichloride, $ZrCl_4$, tungsten carbonyl, indenyltris(dimethylamido) zirconium, cyclopentadienyltris(dietheylamido) titanium, and bis(cyclopentadienyl) bis(dimethylamido) titanium.

13. A method for performing a chemical vapor deposition, comprising:
dissolving a precursor suitable for chemical vapor deposition in an inorganic solvent to form a solution, the solvent being selected from the group consisting of liquid ammonia, liquid $NO_2$, liquid $SO_2$, liquid $TiCl_4$, liquid $TaCl_5$, liquid $WF_6$, liquid $SiCl_4$, borazine, dimethyl hydrazine, liquid xenonflourides, liquid phosphine, liquid arsine, diethylzinc, $BCl_3$, $BF_3$, $SF_6$, $H_2S$, $SiF_4$, $CBrF_3$, $CCl_2F_2$, $CCl_3F$, $CClF_3$, $CCl_4$, and $SiH_2Cl_2$;
transporting the solution as a continuous liquid stream to a chemical vapor deposition chamber;
subjecting the solution to a temperature and pressure higher than about twice atmospheric pressure sufficient to maintain the solution in a liquid state during transporting;
nebulizing the liquid stream in the chemical vapor deposition chamber;
applying the solution to a semiconductor wafer surface, wherein the semiconductor wafer is at a temperature less than that of the solution; and
subjecting the solution to a temperature and a vacuum pressure in the chemical vapor deposition chamber by raising the semiconductor wafer to a temperature sufficient to rapidly evaporate the solution after the solvent contacts the semiconductor wafer.

14. The method according to claim 13, further comprising selecting a precursor and a solvent that do not react with each other in liquid form.

15. The method according to claim 13, wherein the precursor is bis(cyclopentadienyl) titanium diazide and the solvent is liquid ammonia.

16. The method according to claim 13, wherein the pressure sufficient to maintain the solution in a liquid state is 120 psi or greater and the temperature sufficient to maintain the solution in a liquid state is 20° C. or less.

17. A method for performing a chemical vapor deposition, comprising:
dissolving zirconium tetrachloride in silicon tetrachloride to form a solution;
transporting the solution as a continuous liquid stream to a chemical vapor deposition chamber;
subjecting the solution to a temperature and pressure higher than atmospheric pressure sufficient to maintain the solution in a liquid state during transporting;
nebulizing the liquid stream in the chemical vapor deposition chamber;
applying the nebulized liquid stream to a semiconductor wafer, wherein the semiconductor wafer is at a temperature less than that of the solution; and
subjecting the nebulized liquid stream on the semiconductor wafer to a high enough temperature and a low enough vacuum pressure in the chemical vapor deposition chamber by raising the semiconductor wafer to a high enough temperature to rapidly evaporate the solvent after the solution contacts the semiconductor wafer.

18. The method according to claim 17, wherein the pressure sufficient to maintain the solution in a liquid state is 60 psi or greater and the temperature sufficient to maintain the solution in a liquid state is between 60° C. and 10° C.

19. A method for performing a chemical vapor deposition, comprising:
dissolving a precursor suitable for chemical vapor deposition in an inorganic solvent to form a solution;
transporting the solution as a continuous liquid stream to a chemical vapor deposition chamber;
subjecting the solution to a temperature and pressure about twice atmospheric pressure sufficient to maintain the solution in a liquid state during transporting;
nebulizing the liquid stream in the chemical vapor deposition chamber; and
rapidly evaporating the nebulized liquid stream in the chemical vapor deposition chamber by raising a temperature of a semiconductor wafer after the solution contacts the semiconductor wafer.

20. The method according to claim 19, further comprising selecting a precursor and a solvent that do not react with each other in liquid form.

21. The method according to claim 19, wherein the inorganic solvent is liquid ammonia.

22. The method according to claim 19, wherein the precursor is selected from the group consisting of bis (cyclopentadienyl) titanium dichloride, ZrCl$_4$, tungsten carbonyl, indenyltris(dimethylamido) zirconium, cyclopentadienyltris(dietheylamido) titanium, and bis(cyclopentadienyl) bis(dimethylamido) titanium.

23. The method of claim 19, wherein the inorganic solvent is a volatile inorganic solvent.

24. A deposition method, comprising:
maintaining a solution of a precursor and liquid solvent in a liquid form, wherein the liquid solvent is an inorganic liquid;
transporting the solution as a liquid stream to a deposition chamber;
nebulizing the liquid stream in the deposition chamber; and
rapidly evaporating the nebulized liquid stream in the deposition chamber by raising a temperature of a semiconductor wafer after the solution contacts the wafer.

25. The method of claim 24, wherein evaporating the solution includes raising the temperature of the solution.

26. The method of claim 24, wherein evaporating the solution includes lowering the pressure acting on the solution.

27. The method of claim 24, wherein maintaining the solution includes subjecting the solution to a temperature and pressure that keeps the solution in the liquid form.

28. The method of claim 24, wherein transporting the solution includes subjecting the solution to a temperature and pressure that keeps the solution in the liquid form.

29. The method of claim 24, wherein the precursor is selected from the group consisting of bis(cyclopentadienyl) titanium dichloride, ZrCl$_4$, tungsten carbonyl, indenyltris(dimethylamido) zirconium, cyclopentadienyltris(dietheylamido) titanium, and bis(cyclopentadienyl) bis(dimethylamido) titanium.

30. The method of claim 24, wherein maintaining the solution includes selecting the precursor and the solvent so that they do not react with each other in the liquid form.

31. The method of claim 24, wherein evaporating the solution in the deposition chamber includes chemical vapor depositing the precursor on a wafer.

32. The method of claim 31, wherein chemical vapor depositing the precursor includes reacting the precursor with a reactant on the wafer.

33. The method of claim 24, wherein maintaining the solution in a liquid form includes subjecting the solution to a pressure of 60 psi or greater and a temperature between 60° C. and 10° C.

34. The method of claim 24, wherein evaporating the solution in the deposition chamber includes subjecting the solution to a pressure of 10 torr and a temperature of 600° C.

35. The method of claim 24, wherein nebulizing the liquid stream in the chemical vapor deposition chamber includes delivering the nebulized stream to a surface of a substrate, and wherein evaporating the nebulized liquid stream includes subjecting the solution to a temperature and a pressure in the chemical vapor deposition chamber sufficient to form a film on the surface of the substrate.

* * * * *

UNITED STATES PATENT AND TRADEMARK OFFICE
CERTIFICATE OF CORRECTION

PATENT NO. : 7,182,979 B2
APPLICATION NO. : 10/213030
DATED : February 27, 2007
INVENTOR(S) : Westmoreland et al.

It is certified that error appears in the above-identified patent and that said Letters Patent is hereby corrected as shown below:

In column 3, line 4, delete "cyclopentadienly" and insert -- cyclopentadienyl --, therefor.

In column 4, line 23, delete "ZrCl4" and insert -- $ZrCl_4$ --, therefor.

In column 5, line 1, in Claim 3, delete "xenonfourides" and insert -- xenonflourides --, therefor.

In column 5, line 12, in Claim 7, delete "cyclopentadienylitris" and insert -- cyclopentadienyltris --, therefor.

Signed and Sealed this

Twelfth Day of June, 2007

JON W. DUDAS
*Director of the United States Patent and Trademark Office*